United States Patent [19]

Ishizawa et al.

[11] Patent Number: 4,777,624
[45] Date of Patent: Oct. 11, 1988

[54] DYNAMIC MEMORY DEVICE

[75] Inventors: Hiroaki Ishizawa; Hisao Suzuki, both of Ebina, Japan

[73] Assignee: Fuji-Xerox Company, Ltd., Tokyo, Japan

[21] Appl. No.: 884,808

[22] Filed: Jul. 11, 1986

[30] Foreign Application Priority Data

Jul. 16, 1985 [JP] Japan .............................. 60-156710

[51] Int. Cl.⁴ ............................................. G11C 13/00
[52] U.S. Cl. .................................... 365/189; 365/222; 365/238
[58] Field of Search ............... 365/189, 230, 238, 174, 365/222

[56] References Cited

U.S. PATENT DOCUMENTS 3,737,879  6/1973  Greene et al. ...................... 365/222

Primary Examiner—Terrell W. Fears
Attorney, Agent, or Firm—Schwartz & Weinrieb

[57] ABSTRACT

A dynamic memory device comprises a dynamic memory circuit, an input buffer circuit for temporarily storing data each time it is received from a source external to the device; an output buffer circuit for temporarily storing data each time it is read out from the dynamic memory circuit and for outputting the stored data in a unit of a predetermined number of words each time a request for reading is made; and a control circuit for controlling the input and output buffer circuits so that reading and writing operations can be performed independently of a refreshing operation.

9 Claims, 2 Drawing Sheets

FIG. 2
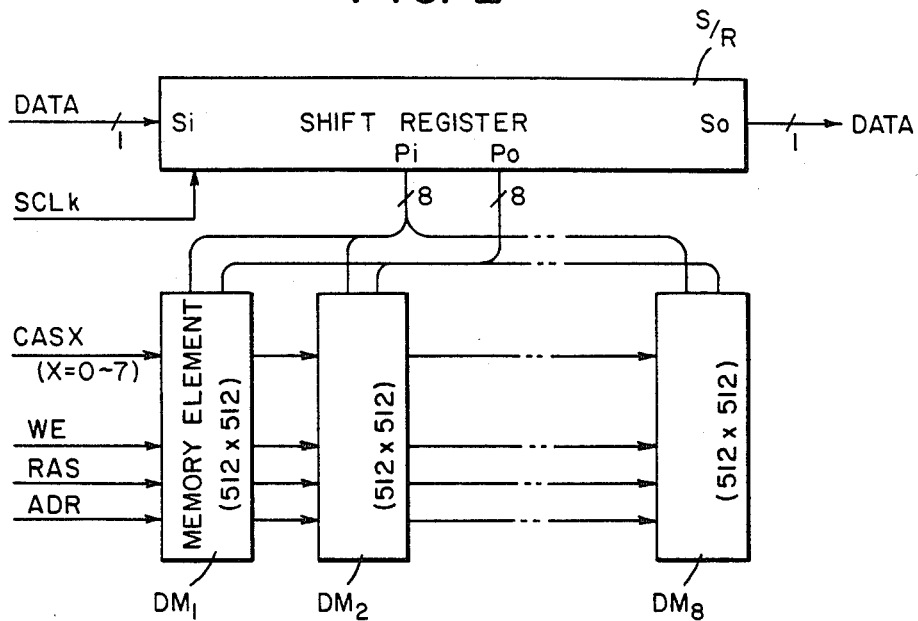
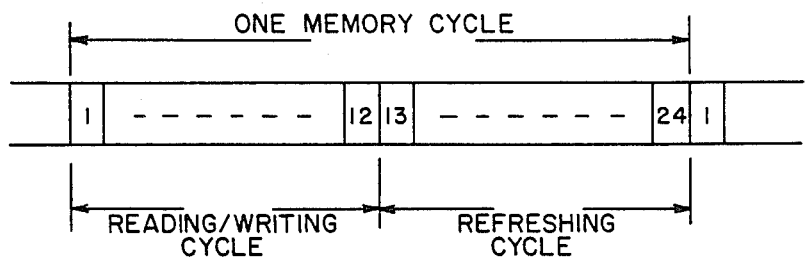
FIG. 3
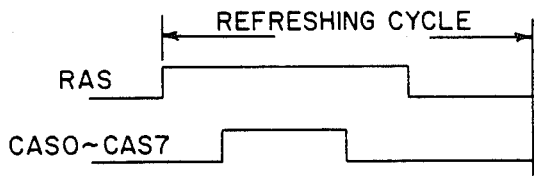
FIG. 4

DYNAMIC MEMORY DEVICE

BACKGROUND OF THE INVENTION

1. Field of the Invention

The present invention generally relates to a memory device. More particularly, the present invention relates to a dynamic memory device having a large capacity.

2. Description of the Prior Art

Conventionally, a dynamic memory device is well known in that it can be manufactured at low manufacturing cost levels per bit, it is formed so as to be small in size with a large capacity, and it can be operated at a high rate of speed in comparison with static memory devices. Therefore, the dynamic memory device has been commonly and broadly used as a data processor which requires a large memory capacity and high speed processing.

However, an operation for refreshing the information stored in the dynamic memory device, that is, a "refreshing operation", should be executed within an interval of time of 2 ms, so that such a dynamic memory device cannot be used for storing or reading the information during such a refreshing operation. Thus, such a conventional dynamic memory device causes a problem in that the storing and reading speed of the data processor including such a dynamic memory device is limited.

OBJECTIVE OF THE INVENTION

With this problem in mind, it is an object of the present invention to provide an improved dynamic memory device which can execute its storing or reading operation independently of the refreshing operation.

SUMMARY OF THE INVENTION

To accomplish the above described object, the dynamic memory device according to the present invention comprises a dynamic memory circuit, a first buffer circuit for temporarily storing data each time it is supplied from a remote source; a second buffer circuit for temporarily storing data each time it is read out from the dynamic memory circuit, and for outputting the data of a predetermined number of words as a unit in response to a reading request from a remote source; an input words number detecting circuit for detecting the fact that the number of words stored in the first buffer circuit reaches a predetermined number; a read words number detecting circuit for detecting the fact that the number of words read from the second buffer circuit reaches a predetermined number; and a control circuit for controlling the writing of data stored into the first buffer circuit in the dynamic memory circuit when a detected signal is input from the input words number detecting circuit, for controlling the reading of new data from the dynamic memory circuit when a detected signal is input from the read words number detecting circuit, and for controlling the refreshing of the dynamic memory circuit by means of a predetermined word unit each time data is stored or read out.

The dynamic memory device according to the present invention executes as follows. As a predetermined number of words of data is stored in the first buffer circuit, this stored data is written in the dynamic memory circuit according to the writing control function of the control circuit. On the other hand, as a read-request signal is input into the device, the data temporarily stored in the second buffer circuit is output to an external or remove location. When the amount of data read from the second buffer circuit reaches a predetermined number, new data in the succeeding address is read from the dynamic memory circuit and this data is temporarily stored in the second buffer circuit.

During these operations, the control circuit repeats a refreshing operation with respect to a predetermined words unit whenever the data is stored or read. Thus, the memory capacities of the first buffer circuit and the second buffer circuit and the number of detecting words of the input words number detecting circuit and the read words number detecting circuit are arranged such that the time period for generation of the detecting signal output from the input words number detecting circuit or the read words number detecting circuit is longer than the average period of time required for storing the data from the remote source or reading out the data to the remote location by means of at least a period of time required for accomplishing the refreshing operation. According to this arrangement, it is possible to provide a dynamic memory device which is capable of reading or writing data independently of the refreshing operation.

BRIEF DESCRIPTION OF THE DRAWINGS

Various other objects, features, and attendant advantages of the present invention will become better understood from the following detailed description of the invention, when considered in connection with the accompanying drawings, in which like reference characters designate like or corresponding parts throughout the several views, and wherein:

FIG. 2 is a block diagram showing the detailed structure of a memory circuit in the embodiment shown in FIG. 1;

FIG. 3 is a time chart for explaining one memory cycle for executing a data reading or writing operation and a data refreshing operation; and FIG. 4 is a time chart for explaining the refreshing operation.

DESCRIPTION OF THE PREFERRED EMBODIMENT

Figure 1:
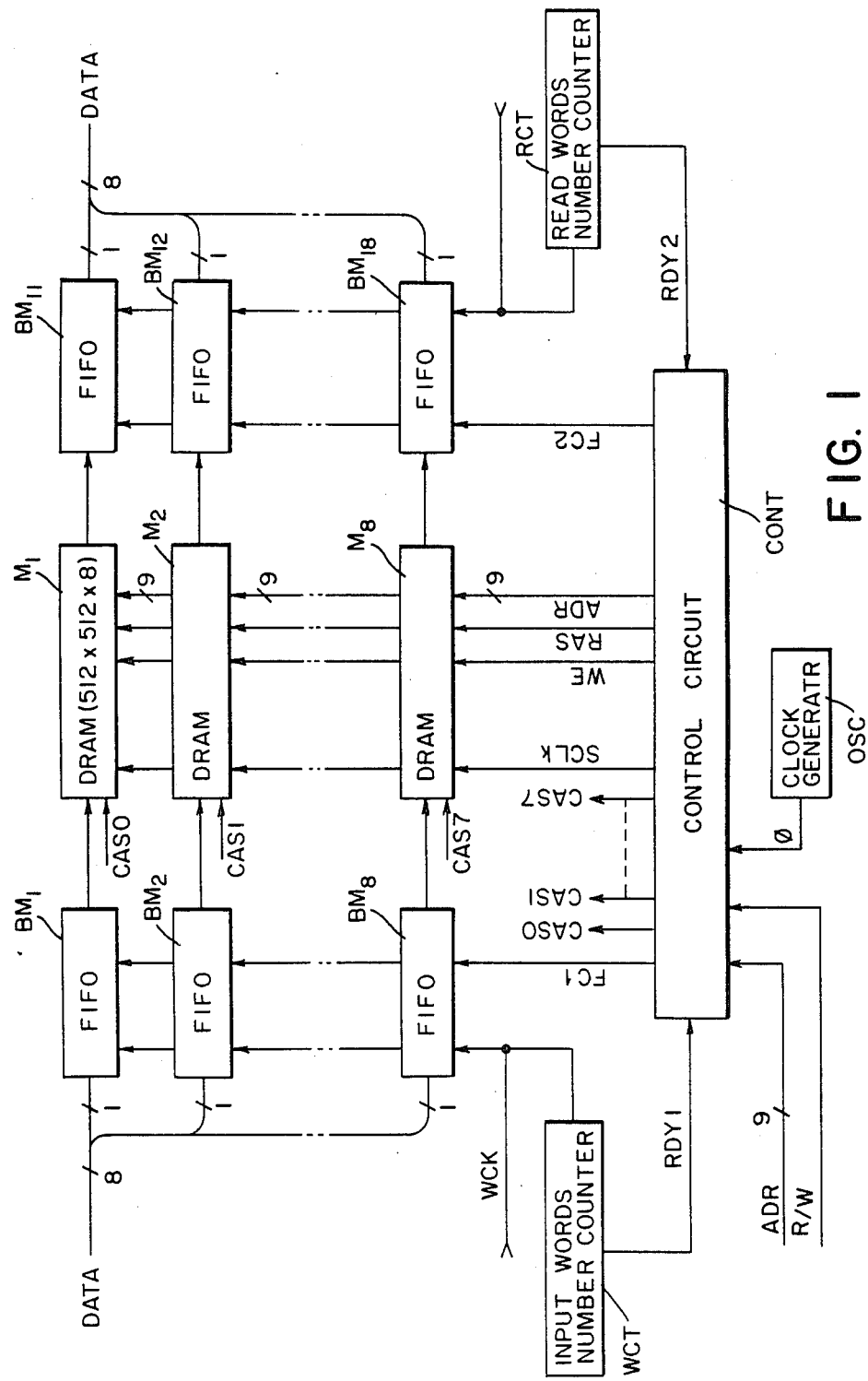
FIG. 1 is a block diagram showing one embodiment of the present invention.

Hereinbelow, the present invention will be explained in detail while referring to the accompanying drawings.

FIG. 1 is a block diagram showing one embodiment according to the present invention. In the drawing, the references M1 to M8 denote dynamic memory circuits having respectively a memory capacity of 2,097,152 bits and each circuit is composed of eight dynamic memory elements each of which has a memory capacity of $512 \times 512$ bits. Respective input terminals of these dynamic memory circuits M1 to M8 are connected to buffer memories BM1 to BM8 according to their numerical order. These buffer memories have a memory capacity of 64 bits, respectively. Each buffer memory is of the first-in first-out type; that is, each buffer memory stores data of one bit input from a remote source in the order of input and outputs the data in this order. Thus one word of the data is divided into 8 bits and this divided one bit data is respectively input into the buffer memory circuits BM1 to BM8.

On the other hand, the output terminals of the memory circuits M1 to M8 are respectively connected to buffer memories BM11 to BM18 according to their numerical order. These buffer memories have respectively a memory capacity of 64 bits. Each buffer memory is also of the first-in, first-out type which is operated in the same manner as the above buffer memories BM1 to BM8.

In addition to these components, an input words number counter WCT for detecting that the buffer memories BM1 to BM8 have been stored with the data N=8 words, a read words number counter RCT for detecting that the buffer memories BM11 to BM18 have read the data N=8 words, and a control circuit CONT for controlling writing of the data stored in the buffer memories BM1 to BM8 into the memory circuits M1 to M8, reading of the data stored in the memory circuits M1 to M8, storing of such read data into the buffer memories BM11 to BM18, and refreshing the memory circuits M1 to M8, are also provided. Furthermore, in the drawing, the reference OSC represents a clock generator for generating a clock signal $\phi$ of, for example, 50 MHz.

FIG. 2 is a block diagram showing a detailed structure of the memory circuits M1 to M8. Each memory circuit is composed of a shift register S/R containing serial-in serial-out signal terminals Si and So and parallel-in parallel-out signal terminals Pi and Po for 8 bits, and 8 dynamic memory elements DM1 to DM8. The data (DATA) stored in the buffer memories BM1 to BM8 is read out therefrom in serial form for each bit, respectively and input into the serial-in signal terminal Si of the shift register S/R of corresponding dynamic memory circuits M1 to M8. When such serial input operations for 8 bits have been completed, this 8 bits data is output from the parallel-out signal terminal Po and input into each data input terminal Di of the dynamic memory elements DM1 to DM8 in parallel. The input data is stored in an address specified by a row address and a column address according to an address signal ADR. The row address is designated by activating a row address signal RAS and transmitting a required row address value as the address signal ADR. On the other hand, the column address is designated by activating a column address signal CAS and transmitting a required column address value as the address signal ADR. Furthermore, in order to execute the data writing operation, a write enable signal WE is activated.

As a whole, one word is composed of 8-bit data stored in parallel in the memory elements DMx (x=1 to 8) of respective dynamic memory circuits M1 to M8. Thus the column address signal CAS is switched in the order of CAS 0 to CAS 7 so as to write the data representing one word. According to this operation, the writing operation for one word is completed. This operation is repeated eight times so that the data for eight words stored in the shift register S/R is written in the memory elements DM1 to DM8.

In a reading mode wherein the write enable signal WE is not activated, the required row address value and column address value are designated by the address signal ADR so that one bit data stored in this indicated address is read from the dynamic memory element DMx (x=1 to 8). This read signal is input into the parallel-in input terminal Pi of the shift register S/R and then stored in the (x)th stage of the shift register S/R. Such an address designating operation repeated eight times in order to store eight bits serial data into the respective stages of the shift register S/R. During such a data writing or reading operation, the memory circuit whose signal CAS is active is refreshed.

Referring to the time charts shown in FIG. 3 and FIG. 4, various operations in the data writing mode, data reading mode and waiting mode, and the refreshing operations in the respective modes will be described as follows:

(a) Data Writing Mode

This mode repesents the fact that the data input from the remote source will be written in the buffer memories BM1 to BM8 and further written in the memory circuits M1 to M8.

In this writing mode, a read/write control signal R/W is initially supplied to the control circuit CONT, so that the control circuit CONT is set in the writing mode. Then, the address signal ADR representing the address (row address and column address) to be stored is supplied and subsequently data and the writing clock signal WCK in synchronism with the data are supplied to the control circuit CONT. The data input from the remote source is stored in the buffer memories BM1 to BM8 in the order of input according to the writing clock signal WCK.

On this occasion, in accordance with the writing clock signal WCK, the input words number counter WCT starts to count the number of words of data input from the remote sorce. As the counted value of the counter WCT reaches, for example, eight words, the counter WCT outputs a signal RDY 1 into the control circuit CONT. Then the control circuit CONT generates a clock signal FC1 for writing the data input from the remote source and feeds this clock signal to the buffer memories BM1 to BM8. According to this signal, the data for eight words stored during the first period among the data stored in the buffer memories BM1 to BM8 is read in the order of input and input into the memory circuits M1 to M8. All of these operations are diagrammatically illustrated in FIG. 1.

The respective shift registers S/R of the memory circuits M1 to M8 receive a shift clock signal SCLK from the control circuit CONT in synchronism with the clock signal FC1. In accordance with this signal, the eight words data read from the buffer memories BM1 to BM8 is respectively stored in the shift registers S/R of the memory circuits M1 to M8. Then the control circuit CONT supplies the address signal ADR to the respective memory elements DM1 to DM8 in order to write the data stored in the respective shift register S/R. Furthermore, the control circuit outputs the signal RAS in order to determine the row address and changes the signal CAS from CAS 0 to CAS 7 one by in order to determine the column address. By means of these signals, the data stored in the shift register S/R is stored into the memory elements DM1 to DM8.

As the writing operation for the first-input 8 words data has been accomplished, the control circuit CONT is kept in the waiting mode until the succeeding input data reaches eight words; that is, until the signal RDY is output from the input words number counter WCT. In this waiting mode, the memory elements DM1 to DM8 are subjected to their refreshing operations.

The operation of the control circuit CONT is so designed that one memory cycle comprises twenty-four time slots containing the twelve first half time slots and the twelve latter half time slots as shown in FIG. 3. The twelve first half time slots serve for writing or reading the twelve data, and the latter half time slots serve for carrying out the refreshing operation.

If the clock signal $\phi$ has a frequency of 50 MHz, the period of one memory cycle is 480 ns. When the refreshing operation is executed by multiplying the same eight times so as the account for for each memory element, the required period for refreshing all memory elements DM1 to DM8 is expressed by the following equation:

$$512 \text{ bits} \times 8 \text{ times} \times 480 \text{ ns} = 1.98 \text{ ms}$$

This satisfies the required time of 2 ms which is the refreshing time specified for an ordinary dynamic memory element.

In detail, after the eight words data have been written in the buffer memories BM1 to BM8, the relationship among the memory capacity of buffer memories BM1 to BM8, the average speed of input data and the access period of the data for the memory circuits M1 to M8 (that is, the interval period of generating the signals RDY1 and RDY2) are so arranged that the memory element DM1 is initially refreshed until the new eight words data are input and the memory element DM2 is subsequently refreshed until the succeeding eight words data are input, and so forth. Accordingly, when viewed externally of the device, it appears that the refreshing operation has not been executed. This invention can therefore write data in the memory device regardless of such refreshing operation and thus can assure the writing of data at a high rate of speed.

(b) Data Reading Mode

This mode represents the fact that the data is read from the memory circuits M1 to M8 and output to the buffer memories BM11 to BM18.

In this reading mode, a control signal R/W is initially supplied to the control circuit CONT, so that the control circuit CONT is set in the reading mode. By the address signal ADR, the signals RAS and CAS 0 to CAS 7, the address of the data to be read is determined. First of all, the eight words data are read from the memory elements DM1 to DM8 and such data is written into the respective shift registers S/R of the memory circuits according to the shift clock SCLK. Then the clock signal FC2 is generated in synchronism with the writing of the data into the respective shift register S/R. By means of the clock signal FC2, the data stored in the respective shift register S/R is written into the buffer memories BM11 to BM18 one after another. This reading operation is continued until the buffer memories BM11 to BM18 become full (64 words).

The data of 64 words stored in the buffer memories BM11 to BM18 are read one by one in accordance with the reading clock signal RCK received from the remote source and transmitted to the remote location. On this occasion, the read words number counter RCT counts the clock signal RCK and outputs the signal RDY2 to the control circuit CONT whenever the counted value of the signal RCK reaches 8, that is, the data for 8 words has been transmitted.

The control circuit CONT is shifted to the reading operation for reading out new data so as to again fill the buffer memories BM11 to BM18. This reading operation is executed so as to read new data in proportion to the data transmitted and write the read data into the buffer memories BM11 to BM18.

This reading operation is executed by using twenty-four time slots in the same manner as the writing operation. The memory circuits M1 to M8 are subjected to their refreshing operation until the reading operation for the following 8 words data has been completed. As a result, it is possible to carry out the reading operation regardless of the refreshing operation and thus the present invention can assure reading of the data at a high rate of speed.

(c) Waiting Mode

The waiting mode represents the fact that neither the reading operation nor the writing operation are being performed. In this mode, only the refreshing operation is repeated. As shown in FIG. 4, the signal RAS is switched to the "H" level while keeping the signal CAS at the "L" level after the data writing operation or the data reading operation has been finished, and the signal CAS is switched to the "L" level before the signal RAS changes to the "L" level after a predetermined precharge time. According to this operation, the refreshing operation is automatically carried out by means of the internal circuit in the memory elements DM1 to DM8.

Although this embodiment comprises two buffer memories at both the input and output sides, a single memory may be commonly used for both memories in a time sharing manner taking advantage of the fact that the data writing operation and reading operation are not executed at the same time. In this embodiment, the shift register is arranged in each memory circuit in order to decrease the access speed of the memory elements. Therefore, such is not required if the operational speed of the memory elements is faster than a required value.

In this embodiment, although the refreshing operation is executed each time when the data for one word is read, the refreshing operation does not need to be performed every time the following arrangement is adopted. In this arrangement, the memory capacity of the first buffer circuit and the second buffer circuit and the number of words detected by the input words number detecting circuit and the read words number detecting circuit are so determined that a period of time for generating the detected output signal from the input words number detecting circuit or the read words number detecting circuit is longer than an average period of time for writing or reading the data from or to the remote source or location by at least the period of time required for the refreshing operation. This arrangement can reduce the burden on the control circuit.

It is further understood by those skilled in the art that the foregoing description is a preferred embodiment of the disclosed device and that various changes and modifications may be made in the invention without departing from the spirit and scope thereof.

What is claimed is:

1. A dynamic memory device comprising:
   (a) a dynamic memory circuit having a memory capacity of a predetermined number of words;
   (b) a first buffer circuit for temporarily storing data each time it is supplied from a source external to said device;
   (c) a second buffer circuit for temporarily storing data each time it is read out from said dynamic memory circuit, and for outputting said stored data in a unit of a predetermined number of words each time a request for reading said data is made from a remote location;
   (d) an input words number detecting circuit for detecting the fact that the number of words stored in said first buffer circuit reaches a predetermined number;
   (e) a read words number detecting circuit for detecting the fact that the number of words read out from said second buffer circuit reaches a predetermined number; and
   (f) a control circuit for controlling writing of said data stored in said first buffer circuit into said dynamic memory circuit when a detected signal is input from said input words number detecting circuit, for controlling reading of said data from said dynamic memory circuit when a detected signal is input from said rad words number detecting circuit, and for controlling refreshing of said dynamic memory circuit with a predetermined word unit each time said data is written or read out.

2. The dynamic memory device as set forth in claim 1, wherein the first and second buffer circuits respectively comprise a first-in first-out type buffer memory.

3. The dynamic memory device as set forth in claim 1, wherein:
the memory capacity of said first buffer circuit and said second buffer circuit, and the number of words detected by said input words number detecting circuit and said read words number detecting circuit, are so determined that a period of time for generating a detected output signal from said input words number detecting circuit or said read words number detecting circuit is longer than an average period of time for writing data from said external source or reading out said data by at least a period of time required for said refreshing operation.

4. The dynamic memory device as set forth in claim 1, wherein said dynamic memory circuit is composed of "n" sets of dynamic circuits.

5. The dynamic memory device as set forth in claim 4, wherein said first and second buffer circuits are respectively composed of "n" sets of circuits which are arranged so as to correspond to said "n" sets of said dynamic memory circuit.

6. The dynamic memory device as set forth in claim 1, wherein:
said dynamic circuit comprises a shift register having a memory capacity of "m" bits, said register having serial-in/serial-out terminals and parallel-in/parallel-out terminals, and "m" sets of dynamic memory elements, so that the access speed for said dynamic memory elements is reduced to 1/m of the writing speed of said data received from said external source.

7. The dynamic memory device as set forth in claim 4, wherein:
data to be written from said external source is composed of "n" bits per word and data of each bit is written into each of said "n" sets of said dynamic memory circuits one by one.

8. The dynamic memory device as set forth in claim 4, wherein each bit of one word data composed of "n" bits written in each dynamic memory circuit is read out one by one from each dynamic memory circuit.

9. The dynamic memory device as set forth in claim 1, wherein said first buffer circuit and said second buffer circuit share a single buffer circuit in a time-sharing manner.

* * * * *